(12) United States Patent
Chuang et al.

(10) Patent No.: US 9,901,865 B2
(45) Date of Patent: Feb. 27, 2018

(54) STRUCTURE OF ASSEMBLY GRASP FOR PALLADIUM-ALLOY TUBES AND METHOD FOR MANUFACTURING THE SAME

(71) Applicants: Chien-Hsun Chuang, Taipei (TW); Hsing-Hua Tsai, Taichung (TW)

(72) Inventors: Chien-Hsun Chuang, Taipei (TW); Hsing-Hua Tsai, Taichung (TW)

(*) Notice: Subject to any disclaimer, the term of this patent is extended or adjusted under 35 U.S.C. 154(b) by 57 days.

(21) Appl. No.: 15/085,496

(22) Filed: Mar. 30, 2016

(65) Prior Publication Data
US 2017/0266608 A1    Sep. 21, 2017

(30) Foreign Application Priority Data
Mar. 15, 2016  (TW) .............................. 105107873 A

(51) Int. Cl.
| | | |
|---|---|---|
| *B01D 53/22* | (2006.01) | |
| *B01D 53/04* | (2006.01) | |
| *C25D 7/04* | (2006.01) | |
| *C25D 5/48* | (2006.01) | |
| *C23C 14/24* | (2006.01) | |
| *C23C 14/16* | (2006.01) | |
| *B23K 1/008* | (2006.01) | |
| *C22F 1/14* | (2006.01) | |
| *C22C 5/04* | (2006.01) | |
| *C23C 14/34* | (2006.01) | |
| *B23K 101/06* | (2006.01) | |
| *B23K 101/34* | (2006.01) | |

(52) U.S. Cl.
CPC ......... *B01D 53/22* (2013.01); *B01D 53/0407* (2013.01); *B23K 1/008* (2013.01); *C22C 5/04* (2013.01); *C22F 1/14* (2013.01); *C23C 14/165* (2013.01); *C23C 14/24* (2013.01); *C23C 14/34* (2013.01); *C25D 5/48* (2013.01); *C25D 7/04* (2013.01); *B01D 2053/223* (2013.01); *B01D 2253/1122* (2013.01); *B01D 2256/16* (2013.01); *B23K 2201/06* (2013.01); *B23K 2201/34* (2013.01)

(58) Field of Classification Search
CPC    B01D 53/22; B01D 53/228; B01D 2053/223; B01D 63/06; B01D 63/061; B01D 69/04; B01D 2256/16; B23K 1/008
See application file for complete search history.

(56) References Cited

U.S. PATENT DOCUMENTS

| | | | | |
|---|---|---|---|---|
| 2,961,062 | A * | 11/1960 | Hunter ................... | B01D 53/22 165/905 |
| 5,376,167 | A * | 12/1994 | Broutin .................. | B01D 53/22 55/523 |
| 5,904,754 | A * | 5/1999 | Juda ...................... | B01D 53/228 55/524 |
| 5,931,987 | A * | 8/1999 | Buxbaum .............. | B01D 53/22 55/524 |
| 2004/0244589 | A1* | 12/2004 | Bossard ............... | B01D 53/228 96/11 |

(Continued)

*Primary Examiner* — Jason M Greene

(57) ABSTRACT

A structure of assembly grasp for palladium-alloy tubes and the manufacturing method thereof are described. The structure of assembly grasp for palladium-alloy tubes includes a grasp with a plurality of holes, a plurality of palladium-alloy tubes inserted into the plurality of holes, and an intermetallic compound layer between the palladium-alloy tubes and the inner sidewalls of the plurality of holes.

21 Claims, 12 Drawing Sheets

(56) References Cited

U.S. PATENT DOCUMENTS

| | | | |
|---|---|---|---|
| 2004/0255782 A1* | 12/2004 | Han | B01D 53/22 |
| | | | 96/9 |
| 2006/0248800 A1* | 11/2006 | Miglin | B01D 63/06 |
| | | | 48/198.7 |
| 2007/0209513 A1* | 9/2007 | Shinkai | B01D 53/22 |
| | | | 96/4 |
| 2010/0108016 A1* | 5/2010 | Scharp | F02F 3/003 |
| | | | 123/193.6 |
| 2010/0263538 A1* | 10/2010 | DeVries | B01D 53/22 |
| | | | 96/9 |
| 2014/0311344 A1* | 10/2014 | Bossard | B01D 71/022 |
| | | | 96/8 |

* cited by examiner

STRUCTURE OF ASSEMBLY GRASP FOR PALLADIUM-ALLOY TUBES AND METHOD FOR MANUFACTURING THE SAME

CROSS REFERENCE TO RELATED APPLICATIONS

This application claims priority of Taiwan Patent Application No. 105107873 filed on Mar. 15, 2016, the entirety of which are incorporated by reference herein.

BACKGROUND

Field of the Disclosure

The present disclosure relates to a structure of assembly grasp, and it particularly relates to a structure of assembly grasp for palladium-alloy tubes and method for manufacturing the same.

Description of the Related Art

Hydrogen with a high purity of 6N (99.9999%) to 9N (99.9999999%) is required for the manufacturing of integrated circuits (ICs) and light-emitting diodes (LEDs). For example, the purity of hydrogen used in the metal organic chemical vapor deposition (MOCVD) process is above 7N (99.99999%). Even the hydrogen used for fuel cells must have a high purity of 4N (99.99%) to 6N (99.9999%). However, the purity of hydrogen provided by a general gas cylinder is just 2N (99%). Therefore, hydrogen purification is an important technique in the IC, LED and fuel cell industries, and the critical device for hydrogen purification is the hydrogen purifier.

Palladium has good selectivity for hydrogen and stable physical and chemical properties. Therefore, it is often used as the material for hydrogen purification. The hydrogen purifier is generally made of palladium-plated stainless steel, but the performance is not good enough to produce hydrogen with a high purity. Using palladium-alloy tubes as the material for hydrogen purification is a promising way to get hydrogen with a high purity, but some challenges remain.

BRIEF SUMMARY

In some embodiments, the present disclosure relates to a structure of assembly grasp for palladium-alloy tubes. The structure of assembly grasp for palladium-alloy tubes includes an assembly grasp containing a plurality of holes, a plurality of palladium-alloy tubes inserted into the plurality of holes, and an intermetallic compound layer disposed between the plurality of palladium-alloy tubes and inner sidewalls of the plurality of holes.

In other embodiments, the present disclosure relates to a method for manufacturing a structure of assembly grasp for palladium-alloy tubes. The method includes providing an assembly grasp comprising a plurality of holes, forming a first metal layer on external surfaces of a plurality of palladium-alloy tubes, forming a second metal layer on inner sidewalls of the plurality of holes, wherein one of the first metal layer and the second metal layer includes a high-melting-point metal, and the other one comprises a low-melting-point metal, inserting the plurality of palladium-alloy tubes into the plurality of holes, and reacting the first metal layer with the second metal layer to form an intermetallic compound layer between the plurality of palladium-alloy tubes and the inner sidewalls of the plurality of holes.

In yet other embodiments, the present disclosure relates to a method for manufacturing a structure of assembly grasp for palladium-alloy tubes. The method includes providing an assembly grasp containing a plurality of holes, forming a first low-melting-point metal layer on external surfaces of a plurality of palladium-alloy tubes, forming a first high-melting-point metal layer on inner sidewalls of the plurality of holes, forming a second low-melting-point metal layer on the first high-melting-point metal layer, forming an intermediate metal layer on the first low-melting-point metal layer or on the second low-melting-point metal layer, inserting the plurality of palladium-alloy tubes into the plurality of holes, heating at a temperature of 150° C. to 350° C. in a furnace under protective atmosphere or vacuum for 10 minutes to 60 minutes to react the first low-melting-point metal layer, the intermediate metal layer, the second low-melting-point metal layer and the first high-melting-point metal layer between the inner sidewalls of the plurality of holes and the plurality of palladium-alloy tubes to form an intermetallic compound layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
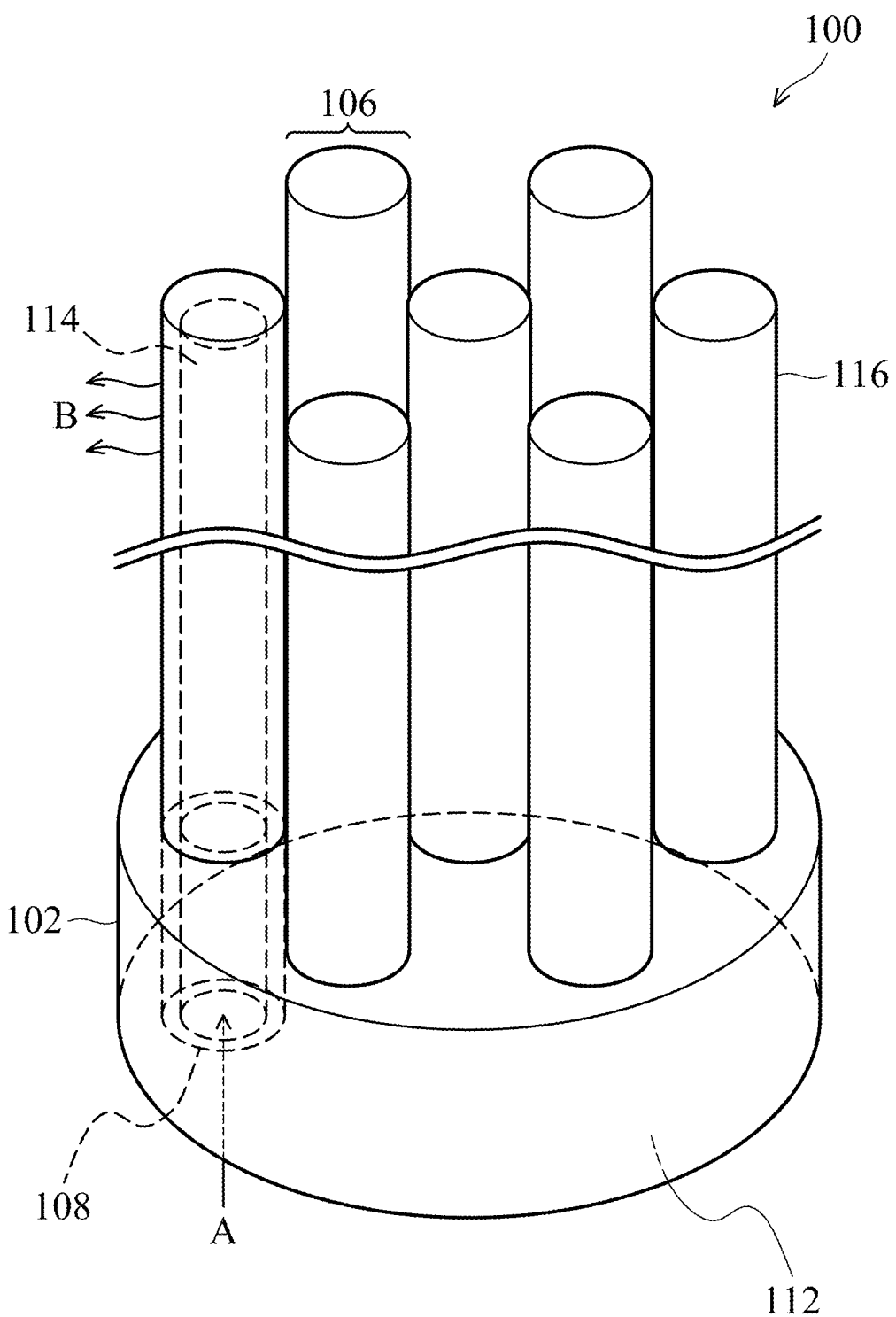
FIG. 1 illustrates a perspective drawing of a structure of assembly grasp for palladium-alloy tubes.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, a structure of assembly grasp for palladium-alloy tubes 100 including assembly grasp 102 and palladium-alloy tubes 106 inserted into holes 108 is provided. Hydrogen A with a low purity (e.g., 99% or 2N) enters an inner side of an inner sidewall 114 of the palladium-alloy tubes 106 from an opening of the holes 108 in a lower portion 112 of the assembly grasp 102. Since palladium has good selectivity for hydrogen, hydrogen B with a high purity (e.g., 99.9999999% or 9N) can be obtained in an outer side of an outer sidewall 116 of the palladium-alloy tubes 106. The mechanism of hydrogen purification can be described as follows. Hydrogen gas ($H_2$) dissociates on a surface of the palladium-alloy tubes into small hydrogen atoms (H), which can diffuse through the palladium alloy and recombine into hydrogen gas ($H_2$) on the other side. Other impure gases with a larger atom size will be blocked in the inner side of the inner sidewall 114 of the palladium-alloy tubes 106. As such, the hydrogen gas can be purified. Generally, this hydrogen purification process is carried out at a temperature above 350° C.

One challenge of manufacturing a structure of assembly grasp for palladium-alloy tubes is to assemble a tube bundle including several dozens of palladium-alloy tubes 106, while the distance between two adjacent palladium-alloy tubes is just several millimeters. Therefore, the traditional high-temperature joining process such as fusion welding or brazing may cause the deformation or leakage of the palladium-alloy tubes 106. On the other hand, if the soldering process is applied, the low-melting-point metal filler used in the soldering process may cause the structure of assembly grasp for palladium-alloy tubes incapable of withstanding the high temperature (above 350° C.) required for the hydrogen purification process.

A structure of assembly grasp for palladium-alloy tubes in the present disclosure includes at least an intermetallic compound layer as a joining interface of the assembly grasp and the palladium-alloy tubes. The intermetallic compound layer can be formed by a low-temperature process (e.g., 120° C. to 330° C.) and can withstand the high temperature at which the hydrogen purification process is carried out (e.g., above 350° C.).

Manufacturing steps of a structure of assembly grasp for palladium-alloy tubes in some embodiments in the present disclosure will be described with accompanying figures.

Embodiment 1

In this embodiment, two metal layers are respectively formed on external surfaces of palladium-alloy tubes and inner sidewalls of holes in an assembly grasp, and then the two metal layers are reacted to form an intermetallic compound layer which can withstand high temperatures in excess of 350° C.

Figure 2:
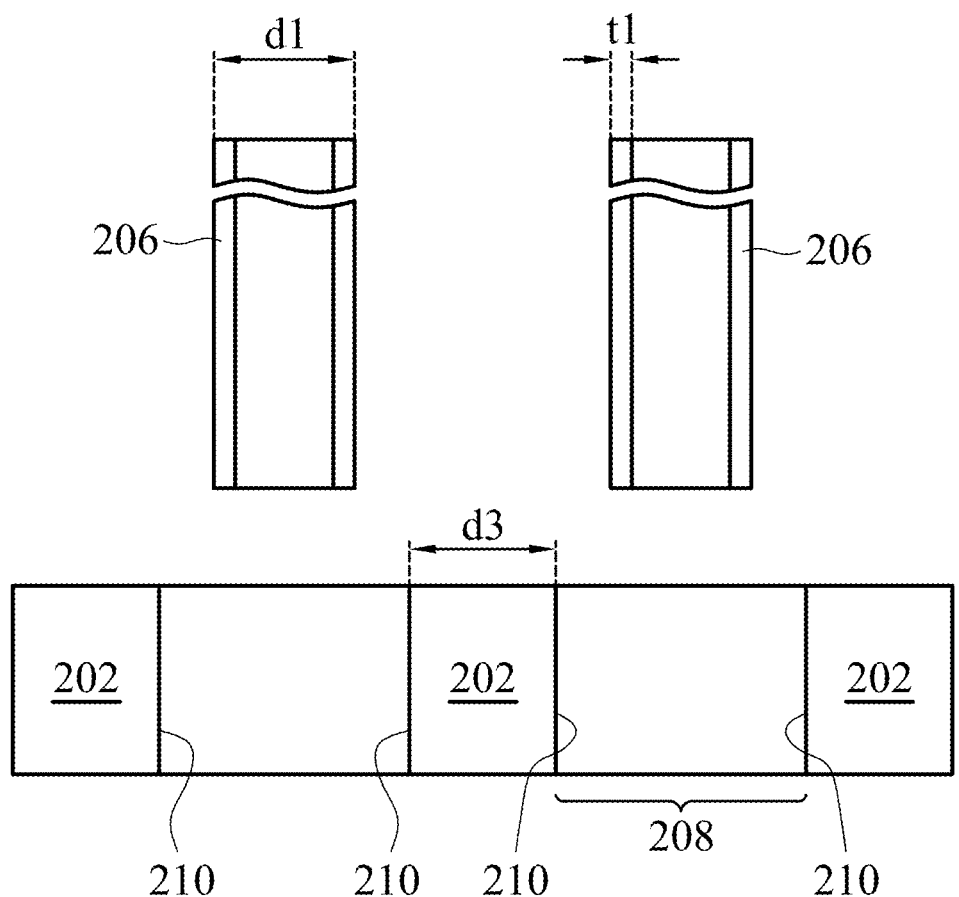
FIG. 2 to FIG. 5 illustrate a series of incremental manufacturing steps in Embodiment 1 as a series of cross-sectional views.

FIG. 2 illustrates a cross-sectional view of a portion of an assembly grasp 202 and palladium-alloy tubes 206. As shown in FIG. 2, the assembly grasp 202 includes a plurality of holes 208 having inner sidewalls 210. Two adjacent holes are separated by a distance d3 (e.g., 1 mm to 10 mm). For example, the palladium-alloy tubes 206 can have an outer diameter of about 1 mm to 3 mm, and a tube-wall thickness of about 50 m to 100 μm. It should be noted that although FIG. 2 illustrates only two palladium-alloy tubes 206 and two holes 208 for simplifying the figure, one skilled in the art can readily appreciate that any adequate number of palladium-alloy tubes 206 and holes 208 can be provided (e.g., twenty to one hundred palladium-alloy tubes 206).

The palladium-alloy tubes 206 can be made of an alloy of Pd—Ag, Pd—Ag—Au, Pd—Ag—Cu, Pd—Ag—Ni or Pd—Ag—Y, for example. A proper concentration of the palladium alloy (e.g., 10-30 wt % Ag and/or 1-10 wt % Au, Cu, Ni or Y) can improve the high temperature mechanical properties and the hydrogen transmission rate of the palladium-alloy tubes 206. The assembly grasp 202 can be made of stainless steel (e.g., SAE304), nickel-plated stainless steel, pure nickel, nickel alloy or a combination thereof, for example.

Figure 3:
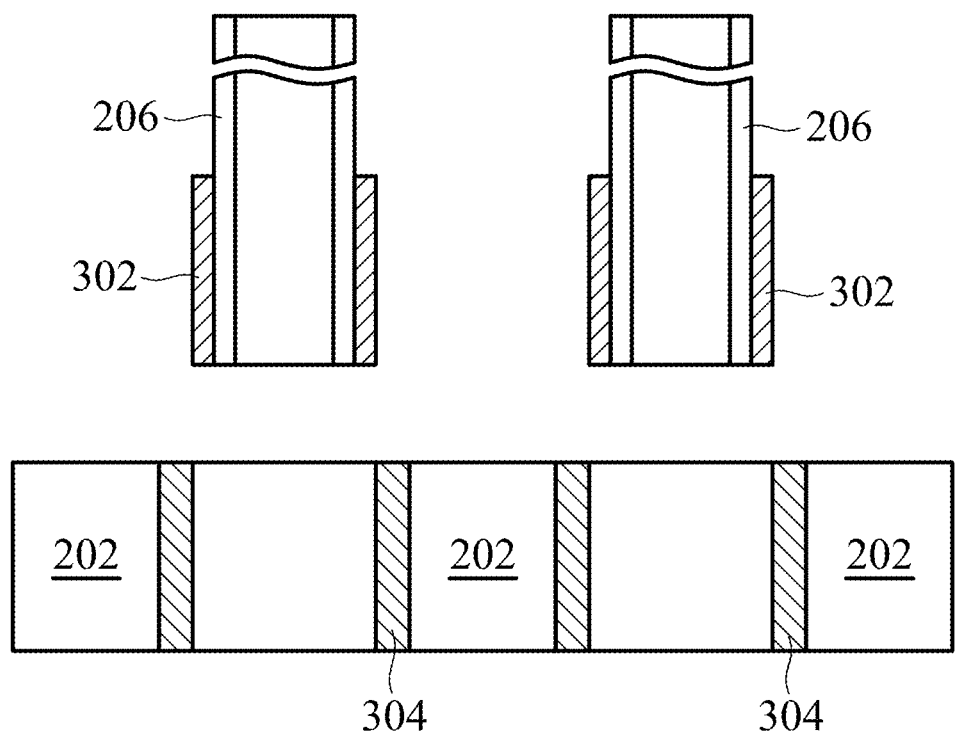

Referring to FIG. 3, at first, a first metal layer 302 is formed on a portion of external surfaces of the palladium-alloy tubes 206, and a second metal layer 304 is formed on the inner sidewalls 210.

The first metal layer 302 and the second metal layer 304 are the precursors for forming an intermetallic compound. One of the first metal layer 302 and the second metal layer 306 includes a high-melting-point metal (e.g., the melting point is about 350° C. to 1500° C.), and the other one includes a low-melting-point metal (e.g., the melting point is about 120° C. to 330° C.). For example, the low-melting-point metal such as Sn, In, or Sn—In alloy, can be formed on the palladium-alloy tubes 206, while the high-melting-point metal such as Ag, or Ni, can be formed on the inner sidewalls 210. However, in some embodiments, the high-melting-point metal can be formed on the palladium-alloy tubes 206, while the low-melting-point metal can be formed on the inner sidewalls 210.

The first metal layer 302 and the second metal layer 304 independently can be formed by electroplating, sputtering, evaporation deposition or any other proper plating processes. To completely transform the low-melting-point metal into the intermetallic compound in subsequent steps, thus improving the high-temperature mechanical properties of the resulting structure, the low-melting-point metal layer typically has a thickness thinner than the high-melting-point metal layer. In some embodiments, the high-melting-point metal layer has a thickness of about 4 μm to 12 μm, and the low-melting-point metal layer has a thickness of about 2 μm to 4 μm.

Figure 4:
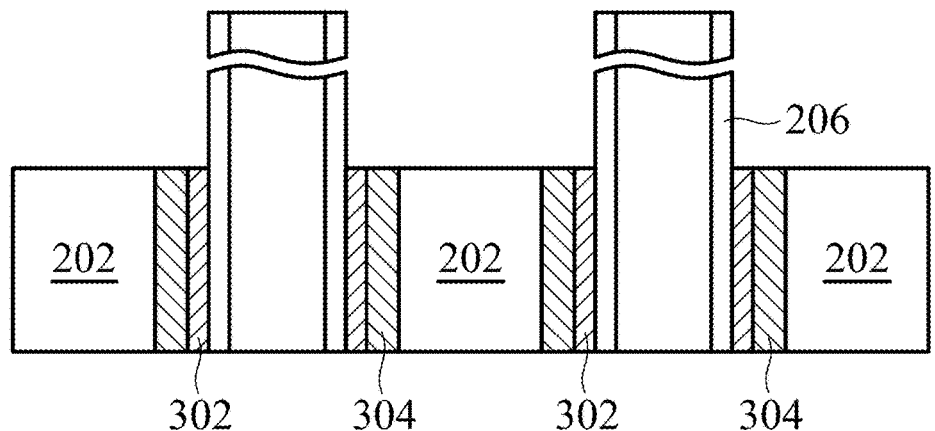

As shown in FIG. 4, the palladium-alloy tubes 206 and the first metal layer 302 formed on the portion of the external surfaces of the palladium-alloy tubes 206 are inserted into the holes 208, making surfaces of the first metal layer 302 and the second metal layer 304 in direct contact.

Figure 5:
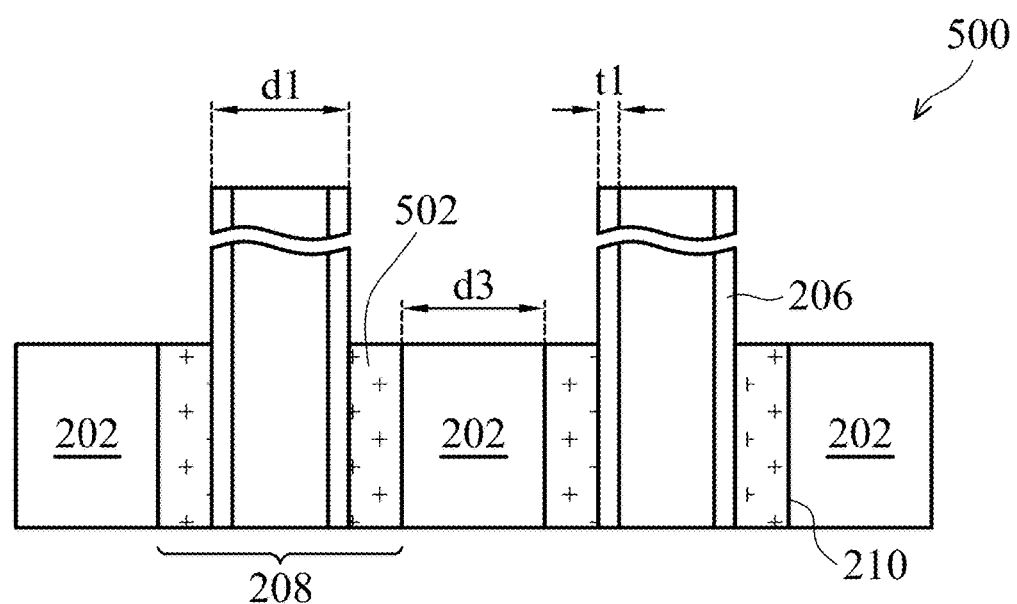

Then, as shown in FIG. 5, the palladium-alloy tubes 206, the first metal layer 302 and the second metal layer 304 are reacted with each other to form an intermetallic compound layer 502 which can withstand high temperatures between the inner sidewalls 210 and the palladium-alloy tubes 206.

The forming of the intermetallic compound layer 502 may include heating in a furnace under protective atmosphere (e.g., a vacuum higher than $10^{-2}$ Torr, or nitrogen atmosphere) to melt the low-melting-point metal, which makes the low-melting-point metal perform a liquid-solid reaction with the high-melting-point metal or the palladium-alloy tubes. In some embodiments, the low-melting-point metal is completely transformed into the intermetallic compound by heating at a temperature of 150° C. to 350° C. in a furnace under protective atmosphere or vacuum for 10 minutes to 60 minutes. Besides, during the forming of the intermetallic compound layer 502, an adequate pressure can be applied to the first metal layer 302 and the second metal layer 304 to improve the bonding.

The intermetallic compound layer 502 can have a melting point of 350° C. to 1500° C. Therefore, a structure of assembly grasp for palladium-alloy tubes 500 can be applied to a high temperature process (e.g., hydrogen purification process). The intermetallic compound layer 502 may include an intermetallic compound of Ag—In, Pd—In, Ni—Sn, Ni—In, Pd—Sn, Ag—Sn or a combination thereof. Besides, the intermetallic compound layer 502 may also bond the palladium-alloy tubes 206 and the assembly grasp 202 with a bonding strength (e.g., 10 MPa to 15 MPa) which is adequate for a subsequent use (e.g., hydrogen purification process).

Although it is not shown in FIG. 5, a portion of the high-melting-point metal of the first metal layer 302 (or the second metal layer 304) may remain between the intermetallic compound layer 502 and the palladium-alloy tubes 206 (or the assembly grasp 202). Besides, the low-melting-point metal (e.g., the melting point is about 120° C. to 330° C.) is completely reacted in the step of forming the intermetallic compound layer 502, and thus the structure of the assembly grasp for palladium-alloy tubes 500 is free or substantially free of the low-melting-point metal between the palladium-alloy tubes 206 and the assembly grasp 202. Therefore, the structure of assembly grasp for palladium-alloy tubes 500 can withstand the high temperature (e.g., above 350° C.) at which the hydrogen purification process is carried out.

Embodiment 2

In this embodiment, four metal precursors are used to form intermetallic compound layers.

Figure 6:
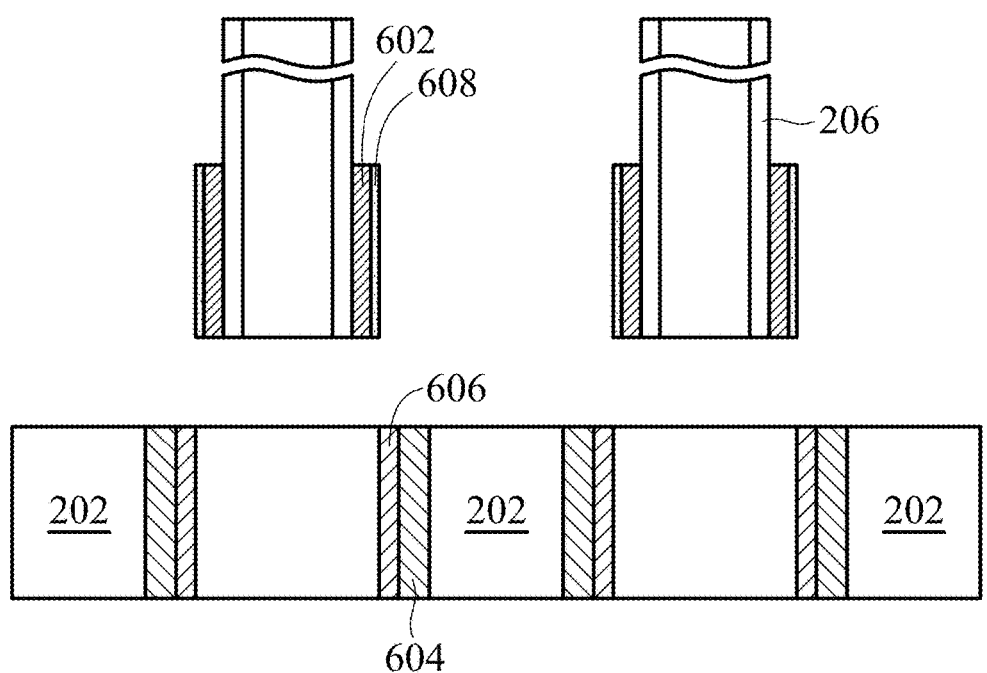
FIG. 6 to FIG. 8 illustrate a series of incremental manufacturing steps in Embodiment 2 as a series of cross-sectional views.

Referring to FIG. 6, at first, a first low-melting-point metal (e.g., Sn, In, or Sn—In alloy) layer 602 is formed on a portion of external surfaces of the palladium-alloy tubes 206, a first high-melting-point metal (e.g., Ni or Ag) layer 604 is formed on the inner sidewalls 210, a second low-melting-point metal (e.g., Sn, In, or Sn—In alloy) layer 606 is formed on the first high-melting-point metal layer 604, and an intermediate metal layer 608 is formed on the first low-melting-point metal layer 602 or on the second low-melting-point metal layer 606 (FIG. 6 is an example of the intermediate metal layer 608 being formed on the first low-melting-point metal layer 602).

The first low-melting-point metal layer 602 and the second low-melting-point metal layer 606 may independently include a low-melting-point metal (e.g., the melting point is about 120° C. to 330° C.). The first high-melting-point metal layer 604 may include a high-melting-point metal (e.g., the melting point is about 350° C. to 1500° C.).

The metal layers 602, 604, 606, and 608 can be independently formed by electroplating, sputtering, evaporation deposition or any other proper plating processes. To completely transform the low-melting-point metal into the intermetallic compound in subsequent steps, thus improving the high temperature mechanical properties of the structure of assembly grasp for palladium-alloy tubes, the low-melting-point metal layer typically has a thickness thinner than the high-melting-point metal layer. In some embodiments, the high-melting-point metal layer has a thickness of about 4 μm to 12 μm, each of the low-melting-point metal layers has a thickness of about 2 μm to 4 μm, and the intermediate metal layer 608 has a thickness of about 1 μm to 3 μm.

Figure 7:
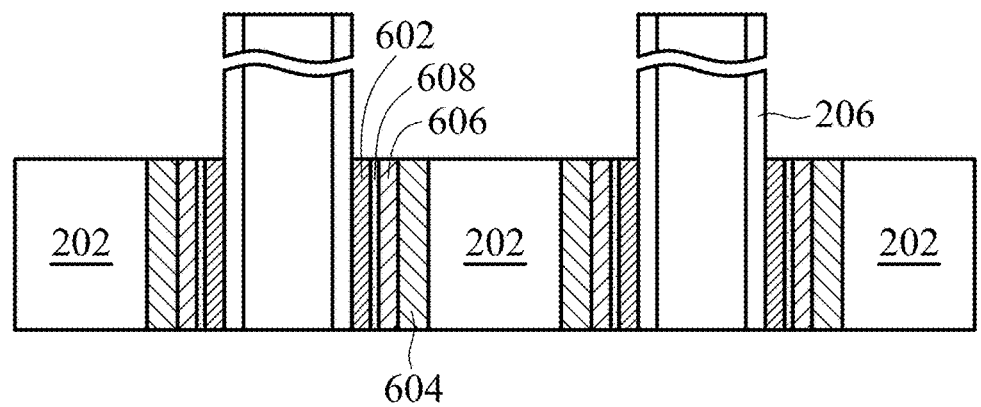

As shown in FIG. 7, the palladium-alloy tubes 206, the first low-melting-point metal layer 602 and the intermediate metal layer 608 formed on the portion of the external surfaces of the palladium-alloy tubes 206 are inserted into the holes 208, making surfaces of the intermediate metal layer 608 and the second low-melting-point metal layer 606 in direct contact.

Figure 8:
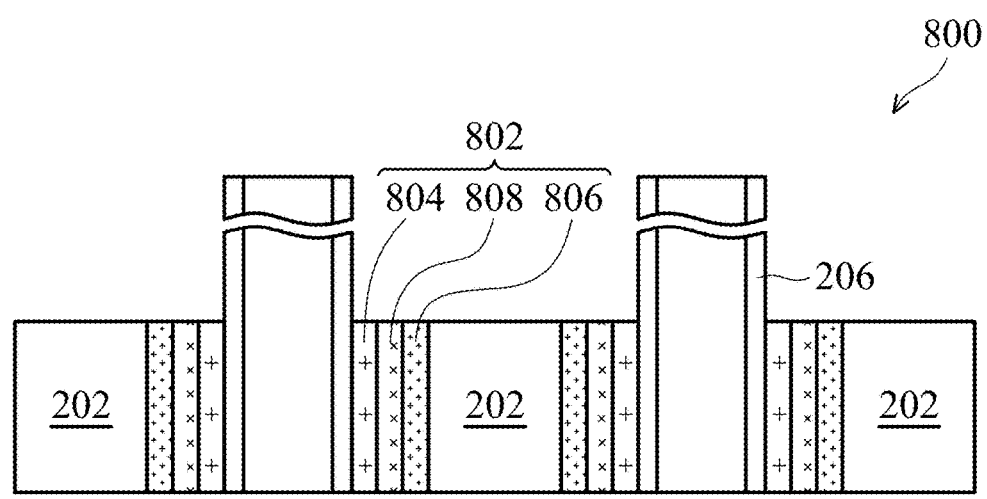

Then, as shown in FIG. 8, the palladium-alloy tubes 206, the first low-melting-point metal layer 602, the intermediate metal layer 608, the second low-melting-point metal layer 606, and the first high-melting-point metal layer 604 are reacted with each other to form an intermetallic compound layer 802 which can withstand high temperatures between the inner sidewalls 210 and the palladium-alloy tubes 206.

The forming of the intermetallic compound layer 802 may include heating in a furnace under protective atmosphere (e.g., a vacuum higher than $10^{-2}$ Torr, or nitrogen atmosphere) to melt the low-melting-point metal, which makes the low-melting-point metal perform a liquid-solid reaction with the high-melting-point metal, the palladium-alloy tubes, or the intermediate metal layer. In some embodiments, the low-melting-point metal can be completely transformed into the intermetallic compound by heating at a temperature of 150° C. to 350° C. in a furnace under protective atmosphere or vacuum for 10 minutes to 60 minutes. Besides, in the forming of the intermetallic compound layer 802, an adequate pressure can be applied to the first low-melting-point metal layer 602, the intermediate metal layer 608, the second low-melting-point metal layer 606, and the first high-melting-point metal layer 604 to improve the bonding.

The intermetallic compound layer 802 can have a melting point of 350° C. to 1500° C. Therefore, a structure of assembly grasp for palladium-alloy tubes 800 can be applied to a high temperature process (e.g., hydrogen purification process). The intermetallic compound layer 802 may comprise an intermetallic compound of Ag—In, Pd—In, Ni—Sn, Ni—In, Pd—Sn, Ag—Sn or a combination thereof. Besides, the intermetallic compound layer 802 may also bond the palladium-alloy tubes 206 and the assembly grasp 202 with a bonding strength (e.g., 18 MPa to 21 MPa) which is adequate for a subsequent use (e.g., hydrogen purification process).

The intermetallic compound layer 802 may include a first sub-layer 804, a second sub-layer 806, and a third sub-layer 808. The first sub-layer 804 may comprise an intermetallic compound of Pd—In, Pd—Sn, or a combination thereof (e.g., PdSn or PdIn$_3$). The second sub-layer 806 may include an intermetallic compound of Ag—Sn, Ag—In, Ni—Sn, Ni—In, or a combination thereof (e.g., Ag$_3$Sn, Ni$_3$Sn$_4$, Ni$_3$In, or Ag$_3$In). The third sub-layer 808 may include an intermetallic compound of Ag—Sn, Ag—In, or a combination thereof (e.g., Ag$_3$Sn, or Ag$_3$In), which can fill the voids or gaps within the intermetallic compound layer 802, thus improving the mechanical properties of the intermetallic compound layer 802.

As described above, there could be a remaining portion of the first high-melting-point metal layer 604 between the intermetallic compound layer 802 and the inner sidewalls 210. Besides, the structure of assembly grasp for palladium-alloy tubes 800 is free or substantially free of the low-melting-point metal between the palladium-alloy tubes 206 and the assembly grasp 202.

Figure 8A:
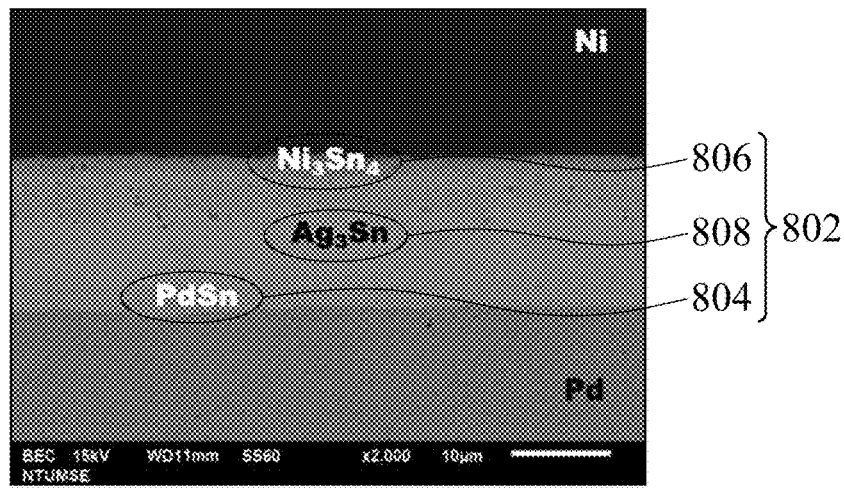
FIGS. 8A and 8B are metallographic pictures of an intermetallic compound layer of a structure of assembly grasp for palladium-alloy tubes manufactured in Embodiment 2.
Figure 8B:
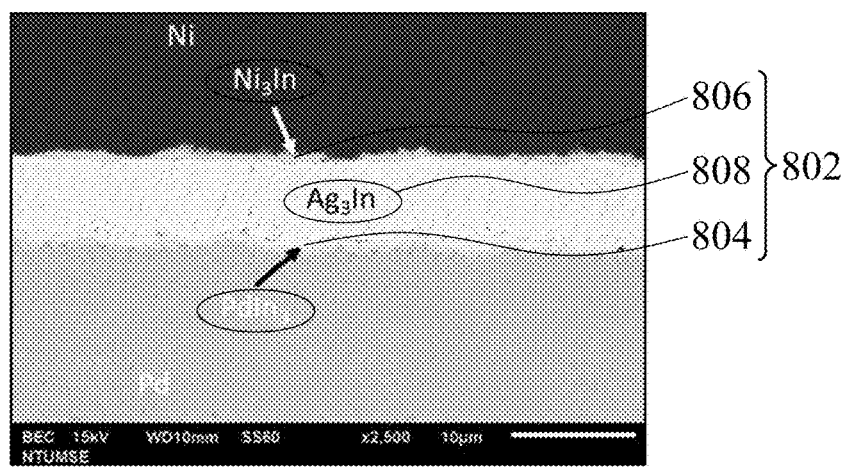

FIGS. 8A and 8B are metallographic pictures of some examples of the intermetallic compound layer 802 and its sub-layers 804, 806, and 808.

Embodiment 3

The same manufacturing processes as in Embodiment 2 are repeated except that a second high-melting-point metal layer is further formed between the first low-melting-point metal layer and the palladium-alloy tubes in this embodiment. Therefore, five metal precursors are used to form intermetallic compound layers.

Figure 9:
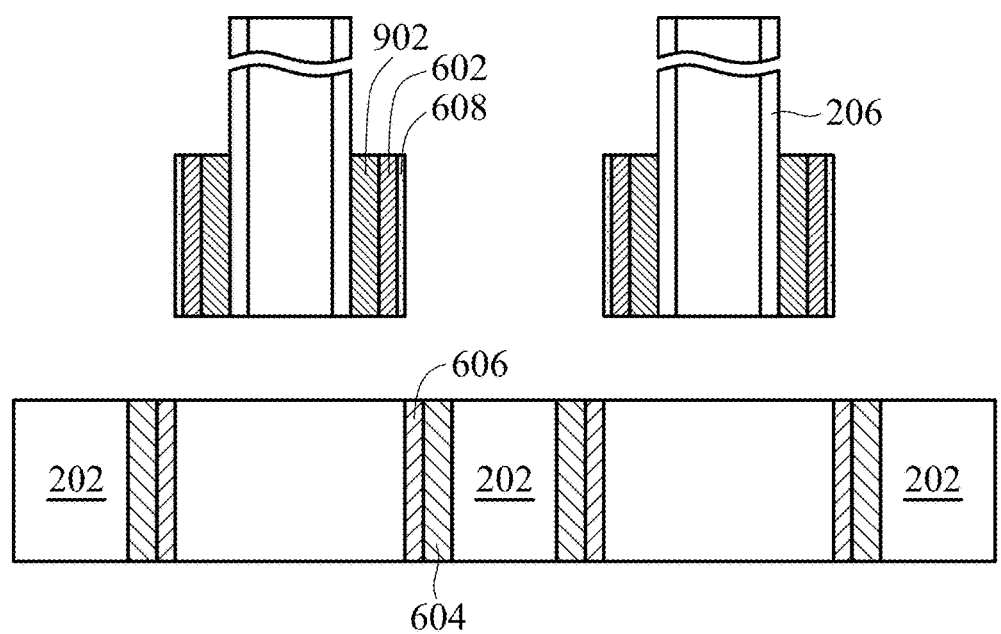
FIG. 9 to FIG. 10 illustrate a series of incremental manufacturing steps in Embodiment 3 as a series of cross-sectional views.

As shown in FIG. 9, a second high-melting-point metal layer 902 is formed between the first low-melting-point metal layer 602 and the palladium-alloy tubes 206. The second high-melting-point metal layer 902 may include features similar to the first high-melting-point metal layer 604.

Figure 10:
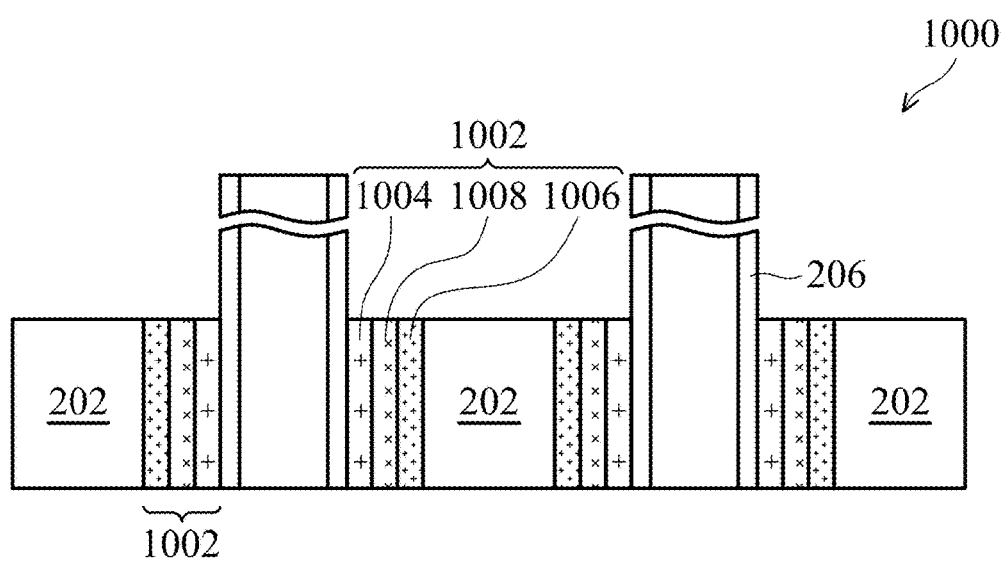

FIG. 10 illustrates a cross-sectional view of a structure of assembly grasp for palladium-alloy tubes 1000 formed in Embodiment 3.

The intermetallic compound layer 1002 can have a melting point of 350° C. to 1500° C. Therefore, the structure of assembly grasp for palladium-alloy tubes 1000 can be applied to a high temperature process (e.g., hydrogen purification process). In some embodiments, the intermetallic compound layer 1002 may comprise an intermetallic compound of Ag—In, Ni—Sn, Ni—In, Ag—Sn or a combination thereof. Besides, the intermetallic compound layer 1002 may also bond the palladium-alloy tubes 206 and the assembly grasp 202 with a bonding strength (e.g., 19 MPa to 25 MPa) which is adequate for a subsequent use (e.g., hydrogen purification process).

The intermetallic compound layer 1002 may include a first sub-layer 1004, a second sub-layer 1006, and a third sub-layer 1008. The first sub-layer 1004 may comprise an intermetallic compound of Ag—Sn, Ag—In, Ni—Sn, Ni—In, or a combination thereof (e.g., $Ag_3Sn$, $Ni_3Sn_4$, $Ni_3In$, or $Ag_3In$). The second sub-layer 806 may comprise an intermetallic compound of Ag—Sn, Ag—In, Ni—Sn, Ni—In, or a combination thereof (e.g., $Ag_3Sn$, $Ni_3Sn_4$, $Ni_3In$, or $Ag_3In$). The third sub-layer 808 may comprise an intermetallic compound of Ag—Sn, Ag—In, or a combination thereof (e.g., $Ag_3Sn$, or $Ag_3In$), which can fill the voids or gaps within the intermetallic compound layer 1002, thus improving the mechanical properties of the intermetallic compound layer 1002.

Figure 10A:
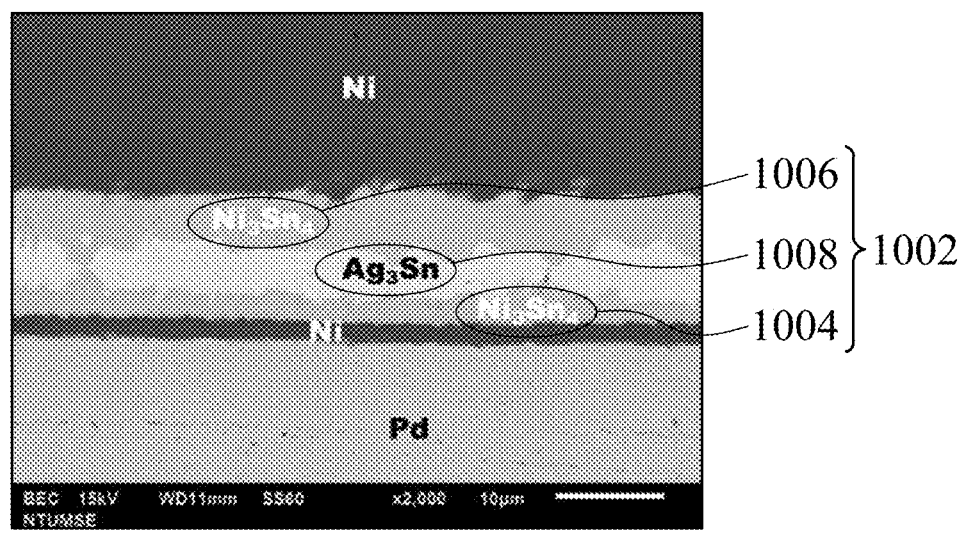
FIG. 10A is a metallographic picture of an intermetallic compound layer of a structure of assembly grasp for palladium-alloy tubes manufactured in Embodiment 3.

FIG. 10A is a metallographic picture of some examples of the intermetallic compound layer 1002 and its sub-layers 1004, 1006, and 1008.

As described above, there could be a remaining portion of the second high-melting-point metal layer 902 between the intermetallic compound layer 1002 and the palladium-alloy tubes 206. There could also be a remaining portion of the first high-melting-point metal layer 604 between the intermetallic compound layer 1002 and the inner sidewalls 210. Besides, the structure of assembly grasp for palladium-alloy tubes 1000 is free or substantially free of the low-melting-point metal between the palladium-alloy tubes 206 and the assembly grasp 202.

Embodiment 4

The same manufacturing processes as in Embodiment 3 are repeated, except that this embodiment further includes a solid solution treatment process which incorporates a portion of the second high-melting-point metal layer into the palladium-alloy tubes.

Figure 11:
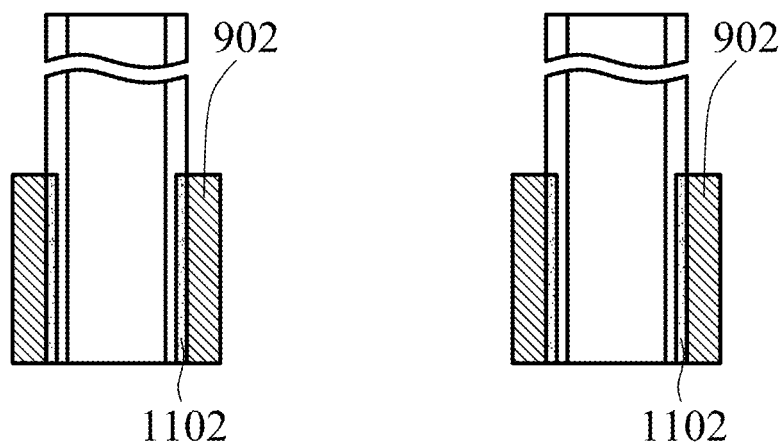
FIG. 11 illustrates one of manufacturing steps in Embodiment 4 as a cross-sectional view.

As shown in FIG. 11, before forming the first low-melting-point metal layer 602, a Pd—Ni solid-solution layer 1102 is formed by performing a solid solution treatment to incorporate a portion of the second high-melting-point metal layer 902 into the palladium-alloy tubes 206. The solid-solution layer 1102 can further improve the mechanical properties of the structure of assembly grasp for palladium-alloy tubes. The solid solution treatment may include heating at a temperature of 450° C. to 550° C. for one hour to two hours. In some embodiments, the intermetallic compound layer 1002 may comprise an intermetallic compound of Ag—In, Ni—Sn, Ni—In, Ag—Sn or a combination thereof. Besides, the intermetallic compound layer 1002 may also bond the palladium-alloy tubes 206 and the assembly grasp 202 with a bonding strength (e.g., 24 MPa to 32 MPa) which is adequate for a subsequent use (e.g., hydrogen purification process).

Figure 11A:
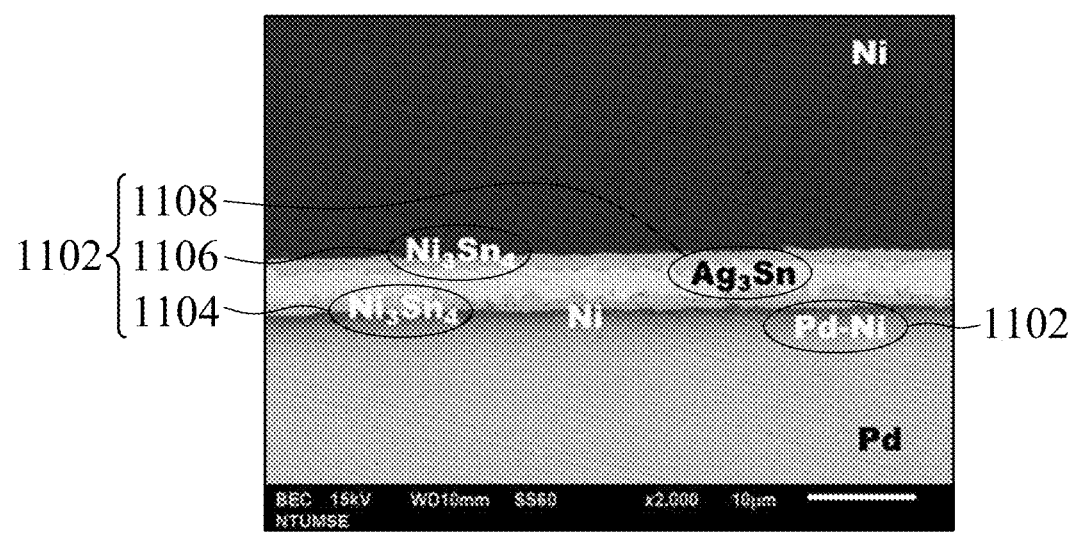
FIG. 11A is a metallographic picture of an intermetallic compound layer and a Pd—Ni solid-solution layer of a structure of assembly grasp for palladium-alloy tubes manufactured in embodiment 4.

FIG. 11A is a metallographic picture of some examples of the Pd—Ni solid-solution layer 1102, the intermetallic compound layer 1002 and its sub-layers 1004, 1006, and 1008.

In summary, some embodiments in the present disclosure disclose some methods for manufacturing a structure of assembly grasp for palladium-alloy tubes. The methods include forming low-melting-point metal layers, high-melting-point metal layers, and intermediate metal layers between palladium-alloy tubes and an assembly grasp, and then at a low temperature, reacting the low-melting-point metal with the palladium-alloy tubes, high-melting-point metal, or the intermediate metal to completely transform the low-melting-point metal into an intermetallic compound which bonds the palladium-alloy tubes and the assembly grasp. Compared to traditional bonding processes such as brazing or soldering, the structure of assembly grasp for palladium-alloy tubes in the present disclosure has low strain in the palladium-alloy tubes and the assembly grasp, and can withstand high temperatures.

In some other embodiments, different metal precursors may be used to form intermetallic compound layers bonding palladium-alloy tubes and an assembly grasp by the aforementioned bonding steps. Besides, different numbers of metal precursor layers may be used to obtain an intermetallic compound layer with different numbers of sub-layers.

It will be appreciated that in this written description, as well as in the claims below, the terms "first", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure of assembly grasp for palladium-alloy tubes, comprising:
    an assembly grasp comprising a plurality of holes;
    a plurality of palladium-alloy tubes inserted into the plurality of holes; and
    an intermetallic compound layer disposed between the plurality of palladium-alloy tubes and inner sidewalls of the plurality of holes.

2. The structure of assembly grasp for palladium-alloy tubes of claim 1, wherein the plurality of palladium-alloy tubes comprise an alloy of Pd—Ag, Pd—Ag—Au, Pd—Ag—Cu, Pd—Ag—Ni or Pd—Ag—Y.

3. The structure of assembly grasp for palladium-alloy tubes of claim 1, wherein the plurality of palladium-alloy tubes have an outer diameter of 1 mm to 3 mm, and a tube-wall thickness of 50 µm to 100 µm.

4. The structure of assembly grasp for palladium-alloy tubes of claim 1, wherein a number of the plurality of palladium-alloy tubes is 20 to 100.

5. The structure of assembly grasp for palladium-alloy tubes of claim 1, wherein the assembly grasp comprises stainless steel, pure nickel or nickel alloy.

6. The structure of assembly grasp for palladium-alloy tubes of claim 1, wherein the intermetallic compound layer comprises an intermetallic compound of Ag—In, Pd—In, Ni—Sn, Ni—In, Pd—Sn, Ag—Sn or a combination thereof.

7. The structure of assembly grasp for palladium-alloy tubes of claim 1, wherein a melting point of the intermetallic compound layer is not less than 350° C.

8. The structure of assembly grasp for palladium-alloy tubes of claim 1, which is free of a metal having a melting point below 350° C. between the plurality of palladium-alloy tubes and the inner sidewalls of the plurality of holes.

9. A method for manufacturing a structure of assembly grasp for palladium-alloy tubes, comprising:
    providing an assembly grasp comprising a plurality of holes;
    forming a first metal layer on external surfaces of a plurality of palladium-alloy tubes;
    forming a second metal layer on inner sidewalls of the plurality of holes, wherein one of the first metal layer and the second metal layer comprises a high-melting-point metal, and the other one comprises a low-melting-point metal;
    inserting the plurality of palladium-alloy tubes into the plurality of holes; and
    reacting the first metal layer with the second metal layer to form an intermetallic compound layer between the plurality of palladium-alloy tubes and the inner sidewalls of the plurality of holes.

10. The method for manufacturing a structure of assembly grasp for palladium-alloy tubes of claim 9, wherein the intermetallic compound layer comprises the intermetallic compound of Ag—In, Pd—In, Ni—Sn, Ni—In, Pd—Sn, Ag—Sn or a combination thereof.

11. The method for manufacturing a structure of assembly grasp for palladium-alloy tubes of claim 9, wherein the forming of the intermetallic compound layer comprises heating at a temperature of 150° C. to 350° C. in a furnace under protective atmosphere or vacuum for 10 minutes to 60 minutes.

12. The method for manufacturing a structure of assembly grasp for palladium-alloy tubes of claim 9, wherein the low-melting-point metal has a melting point of 120° C. to 330° C., and the high-melting-point metal has a melting point not less than 350° C.

13. The method for manufacturing a structure of assembly grasp for palladium-alloy tubes of claim 9, wherein the forming of the intermetallic compound layer comprises completely reacting the low-melting-point metal.

14. A method for manufacturing a structure of assembly grasp for palladium-alloy tubes, comprising:
    providing an assembly grasp comprising a plurality of holes;
    forming a first low-melting-point metal layer on external surfaces of a plurality of palladium-alloy tubes;
    forming a first high-melting-point metal layer on inner sidewalls of the plurality of holes;
    forming a second low-melting-point metal layer on the first high-melting-point metal layer;
    forming an intermediate metal layer on the first low-melting-point metal layer or on the second low-melting-point metal layer;
    inserting the plurality of palladium-alloy tubes into the plurality of holes;
    heating at a temperature of 150° C. to 350° C. in a furnace under protective atmosphere or vacuum for 10 minutes to 60 minutes to react the first low-melting-point metal layer, the intermediate metal layer, the second low-melting-point metal layer and the first high-melting-point metal layer between the inner sidewalls of the plurality of holes and the plurality of palladium-alloy tubes to form an intermetallic compound layer.

15. The method for manufacturing a structure of assembly grasp for palladium-alloy tubes of claim 14, wherein each of the first low-melting-point metal layer and the second low-melting-point metal layer has a melting point of 120° C. to 330° C., and the first high-melting-point metal layer has a melting point not less than 350° C.

16. The method for manufacturing a structure of assembly grasp for palladium-alloy tubes of claim 14, wherein the forming of the intermetallic compound layer comprises completely reacting the first low-melting-point metal and the second low-melting-point metal.

17. The method for manufacturing a structure of assembly grasp for palladium-alloy tubes of claim 14, wherein a portion of the first high-melting-point metal layer is remained after forming the intermetallic compound layer.

18. The method for manufacturing a structure of assembly grasp for palladium-alloy tubes of claim 14, wherein the intermediate metal layer comprises Ag, the first low-melting-point metal layer and the second low-melting-point metal layer independently comprise Sn, In or Sn—In alloy, and the first high-melting-point metal layer comprises Ag or Ni.

19. The method for manufacturing a structure of assembly grasp for palladium-alloy tubes of claim 14, further comprising forming a second high-melting-point metal layer between the first low-melting-point metal layer and the external surfaces of the plurality of palladium-alloy tubes.

20. The method for manufacturing a structure of assembly grasp for palladium-alloy tubes of claim 19, wherein the intermediate metal layer comprises Ag, the first low-melting-point metal layer and the second low-melting-point metal layer independently comprise Sn, In or Sn—In alloy, and the first high-melting-point metal layer and the second high-melting-point metal layer independently comprise Ag or Ni.

21. The method for manufacturing a structure of assembly grasp for palladium-alloy tubes of claim 19, before forming the first low-melting-point metal layer, further comprising:
    performing a solid solution treatment to incorporate a portion of the second high-melting-point metal layer into the plurality of palladium-alloy tubes.

\* \* \* \* \*